(12) United States Patent
Gross et al.

(10) Patent No.: US 6,962,514 B2
(45) Date of Patent: Nov. 8, 2005

(54) METHOD AND APPARATUS USED IN FABRICATION OF MEMS STACKS

(75) Inventors: Harald S. Gross, Fremont, CA (US); Vladimir Goldenberg, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 22 days.

(21) Appl. No.: 10/216,037

(22) Filed: Aug. 8, 2002

(65) Prior Publication Data

US 2004/0029481 A1   Feb. 12, 2004

(51) Int. Cl.$^7$ .............................................. H01J 9/00
(52) U.S. Cl. ..................... 445/24; 445/25; 438/106; 438/107; 438/108; 438/109
(58) Field of Search .................. 445/24; 438/113, 438/106–110

(56) References Cited

U.S. PATENT DOCUMENTS

| | | | | |
|---|---|---|---|---|
| 5,323,051 A | * | 6/1994 | Adams et al. | 257/417 |
| 5,991,484 A | * | 11/1999 | Harpin et al. | 385/49 |
| 6,188,067 B1 | * | 2/2001 | Chutjian et al. | 250/292 |
| 6,225,692 B1 | * | 5/2001 | Hinds | 257/698 |
| 6,281,508 B1 | | 8/2001 | Lee et al. | 250/396 R |
| 6,416,831 B1 | * | 7/2002 | Hara et al. | 428/34.6 |
| 6,452,238 B1 | * | 9/2002 | Orcutt et al. | 257/415 |
| 6,521,513 B1 | * | 2/2003 | Lebens et al. | 438/113 |
| 6,586,315 B1 | * | 7/2003 | Dewa | 438/464 |
| 6,635,509 B1 | * | 10/2003 | Ouellet | 438/106 |

FOREIGN PATENT DOCUMENTS

EP          951069 A1 * 10/1999 ........... H01L 23/10

OTHER PUBLICATIONS

U.S. Appl. No. 09/739,078 of Harold Gross, filed Dec. 13, 2000 which has been allowed.

* cited by examiner

Primary Examiner—Mariceli Santiago
(74) Attorney, Agent, or Firm—Shirley L. Church

(57) ABSTRACT

Disclosed herein are methods of fabricating three dimensional Micro-Electro-Mechanical-Systems (MEMS). This method involved stacking of silicon-containing components which are separated by spacers. The stacked components are precision aligned and then may be bonded, retained or fastened together to form a rigid structure. Spaces created between MEMS device components by the separations may be filled with an electrically isolating fluid such as a gas or vacuum. Also disclosed is a method of aligning components relative to each other and an alignment jig which may be used to align the components.

32 Claims, 13 Drawing Sheets

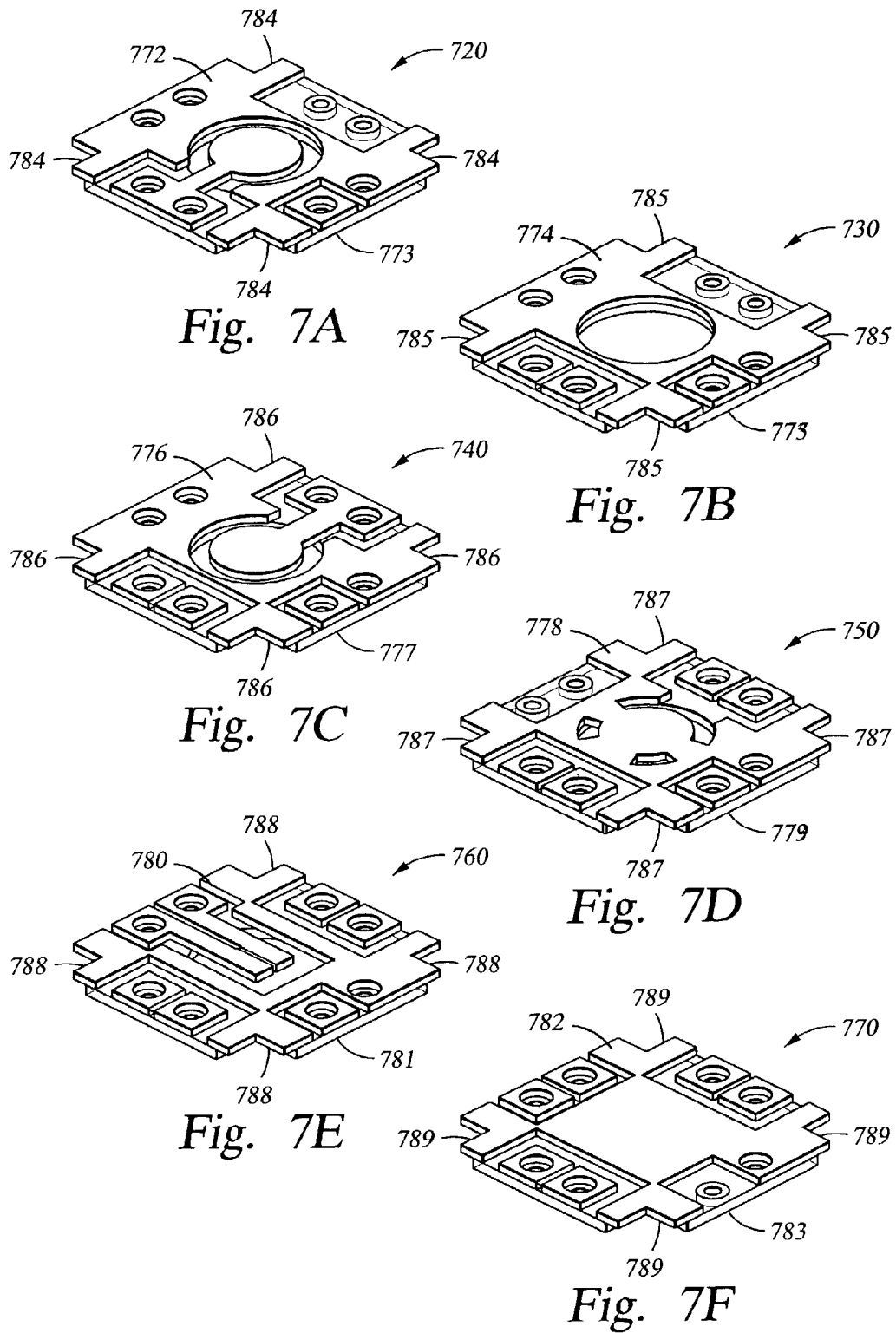

METHOD AND APPARATUS USED IN FABRICATION OF MEMS STACKS

FIELD OF THE INVENTION

The present invention pertains to the fabrication of three dimensional Micro-Electro-Mechanical-Systems (MEMS). In particular, the invention relates to the fabrication of three dimensional MEMS which rely on alignment to provide functionality.

BACKGROUND OF THE INVENTION

Within the field of integrated circuit (IC) fabrication, there is continuing interest in finding ways to increase the density of electronic parts such as transistors, and to shrink the interconnection of these parts. Recently, there has been great interest in miniature machines which combine electrical, optical and mechanical functional features. These micromachines are frequently referred to as Micro-Electro-Mechanical-Systems (MEMS), Bio-MEMS, and Micro-Opto-Electro-Mechanical-Systems (MOEMS).

To produce the miniature electrical devices in MEMS, those skilled in the art frequently use stacks of alternating layers of conductive material, separated by electrically insulating material, with electrical interconnects between various conductive regions in the stack. Typically, the insulating material has been glass which is anodically bonded to a conductive material such as silicon. U.S. patent application Ser. No. 09/739,078, of Harald S. Gross, filed Dec. 13, 2000, assigned to the assignee of the present invention, describes an improved method of anodic bonding of a stack of conductive and electrically insulating glass layers in a single bonding step. Also, U.S. patent application Ser. No. 10/160, 215 of Harald S. Gross, filed on May 28, 2002, assigned to the assignee of the present invention, describes a method of producing electrical interconnects within such a stack of layers.

There is a clear need for a cheap and efficient method of fabricating microelectronic structures which can perform at the temperature capability of silicon, which can be machined to silicon tolerances.

One technology which is used within the MEMS and MOEMS industry is microcolumns. Microcolumns are high-aspect-ratio micromechanical structures including microlenses and deflectors. The microlenses are frequently multilayers of silicon chips (with membrane windows for the lens electrodes) or silicon membranes spaced apart by 100–500 $\mu$m thick insulating layers. The lenses have bore diameters that vary from a few to several hundred $\mu$m. For optimum performance, the structural alignment accuracy between the components should be in the few $\mu$m range. Particularly in the telecommunications industry, in order to achieve high performance, the components like glass fibers are precisely aligned and subsequently bonded.

In the past, there have been several approaches to achieve alignment accuracy. In most cases highly sophisticated tools which utilize marks on the surface of each micro-fabricated structure are used to align the components using an optical inspection tool. However such alignment equipment is very expensive. Also, a satisfying throughput rate can not be achieved with such tools if more than two components need to be aligned. Generally, the optical tool aligns just two components which are subsequently bonded. When three components are involved, the optical tool follows the same procedure; this means that the first two components are aligned and bonded and then the bonded components are then aligned with and bonded to a third component. Therefore, the process itself becomes a serial aligning and bonding method. It can be seen that efficiency of such alignment tool is low. The throughput rate is a function of the number of necessary repetitions in respect to a two component system. Moreover, there is a fast growing demand for applications that require the assembly of more than just two components, and for those applications alignment using optical system would be impractical.

U.S. Pat. No. 6,281,508 B1 issued Aug. 28, 2001 to Lee et al., and assigned to the Assignee of the present invention describes a method and the associated apparatus for alignment and assembly of microlenses and microcolumns. In the Lee et al. patent, aligning structures such as rigid fibers are used to precisely align multiple microlens components. Alignment openings are formed in the microlens components and standard optical fibers are threaded through the openings in each microlens component as they are stacked. However, the patent does not describe how the glass fibers are moved practically during the alignment procedure. Also, the patent does not mention how to achieve the necessary parallelism of the fibers. The second method described in the patent involves a "snap-mechanism" of the fiber into holes of the components, which have a smaller size than the fiber itself. In addition, the method described in this patent is a serial assembly process rather than a parallel assembly. Therefore, the method could run into the problem of throughput efficiency described above. Moreover, the assembly explained in this patent is uses an alternating layers of microlens components with glass which the present invention is trying to avoid.

There is clearly a need for a cheap and efficient method of aligning components of MEMS, bio-MEMS, and MOEMS structures to meet the precision and accuracy requirements described above.

SUMMARY OF THE INVENTION

We have developed a method of fabricating MEMS structures using silicon components which are electrically isolated by a fluid, typically gas or a vacuum. Also disclosed is a cheap and efficient device for aligning components used in the fabrication of microelectronic and/or microoptical structures of the kind fabricated using the presently described method.

One embodiment of a method disclosed herein is the fabrication of a MEMS structure using silicon components which employ gas or vacuum for electrical isolation purposes. As an example, the method includes stacking of at least two silicon components. The method includes placing at least one first spacer on a surface of a first silicon component, then stacking a second silicon component over the first silicon component, with the second silicon component resting on the at least one first spacer. At least one second spacer may be stacked over the second silicon component, followed by stacking a third silicon component over the second spacer and so on. The stacked components are then aligned and retained, fastened or bonded together to form a MEMS structure. Microcolumns of various sizes and shapes can be formed using this method.

Another embodiment of the invention is a method of fabricating the microelectronic components by etching silicon components and spacers on silicon wafers. Stacking the silicon wafers one on top of the other, using an alignment jig and then retaining, fastening, or bonding the stacked wafers together. Components and spacers may be etched on a single wafer, or components may be etched on one wafer while spacers are etched on another wafer, so that the desired structure is obtained when the wafers are stacked.

Another embodiment of the invention is a method of fabricating the microeletronic components by etching silicon-containing components and spacers on silicon-containing wafers, where the components and spacers can be stamped out of the wafer to provide individual components and spacers for a device. The components are then stacked, with the use of the spacers, to provide particular device structures. Prior to bonding, fastening or retaining components within the stacked structure, the components are aligned relative to each other using an alignment jig. The spaces between silicon-containing components may be filled with a gas or vacuum or with a liquid dielectric material which is cured in place to provide electrical isolation of the silicon and other conductive elements present in the device. The silicon-containing components may be retained relative to each other using a retainer or fastener or a built-in interlocking mechanism within the structure.

One apparatus useful in alignment of the components is a specially designed jig fixture we developed which is precise and cost effective. The alignment jig has a base plate where the silicon wafers or components to be aligned are placed. The jig also has a cantilever arm, including a leaf spring which adds flexibility to the cantilever arm. The base plate of the alignment jig has two fixed posts mounted perpendicular to the base plate. The silicon wafers or components to be aligned have grooves, indentations or other shapes which are present at the periphery of the wafer or component, in a manner such that the wafer or component can be stacked against the two fixed posts on the base plate. The alignment jig cantilever arm includes a turning head containing a tilting frame with an internal pin mounted within the tilting frame, which pin pushes against a wall of a wafer or component and generates a rotation. The wafer or component rotates around an axis comprising one of the poles on the base plate which is fitted into a shape (typically a groove) on the wafer or component, until the wafer or component motion is stopped by the second pole on the base plate, which is in contact with another shape on the periphery of the wafer or component. Typically the wafers or components are rotated until two shapes, such as grooves, on the wafers or components are in direct contact with the two poles on the base plate, and a third shape on the periphery of the wafer or component is in contact with the pin on the pusher. The process is applied to a plurality of wafers or components so that when the rotation is stopped the stacked wafers or individual components are all aligned with respect to one another.

Another embodiment of the invention involves an alignment jig which aligns at least two wafers, chips, or device components by utilizing alignment shapes located on the surface of wafers, chips, or device components. The alignment jig has a base plate with two fixed poles where the wafers, chips or device components to be aligned are placed. The jig also has a cantilever arm, which is used in combination with the base plate. The cantilever arm is attached to a stand which is placed on a slider. The slider is on rails which enables the stand to move along a line of pushing. The cantilever arm also has a first holder which is connected to the stand. A leaf spring is connected to the first holder at one end and to a second holder at the other end. The second holder is further attached to a turning head that can freely rotate around the center line of pushing. A tilting frame is rotatably mounted on the turning head so that the tilting frame can tilt freely in respect to the turning head. A pushing pin is mounted within the tilting frame. The alignment jig provides at least four degrees of freedom which include the sliding movement of the stand, movement of the leaf spring at various angles from the line of pushing (and parallel to the base plate), rotation of the turning head circumferentially around the center line of pushing and tilting of the frame in a plane perpendicular to a center line through the turning head.

Another embodiment of the invention involves fabricating a device structure by stacking a number of silicon-containing components and aligning them using a jig such as the one described above and then fastening, retaining or bonding the components together into a rigid structure. The silicon-containing components are separated from one another by spacers which may be of varying height so that the desired nominal spacing is achieved between various components. Disposed in the open spaces between the silicon-containing components may be electrically insulating components, a gas composition, or a vacuum.

BRIEF DESCRIPTION OF THE DRAWINGS

The foregoing and other aspects of the invention will be appreciated in conjunction with the accompanying drawings, and a detailed description which follows.

FIG. 1A shows a schematic of a top view of a silicon-containing chip 108 having a first triangular silicon component 104 etched through it, with silicon bridges 106 holding the silicon component 104 in place within the silicon-containing chip 108.

FIG. 1B shows a schematic of a top view of a portion of a silicon-containing chip 128 having a first set of spacers 129 etched through it, with silicon bridges 126 holding the spacers 129 in place within the silicon-containing chip 128.

FIG. 1C shows a schematic of the top view of a portion of a silicon-containing chip 138 having a second triangular silicon component 144 etched through it. This figure further shows the second triangular component 144 rotated with respect to the frame. This figure also includes additional spacers 146.

FIG. 1D shows a schematic top view of a portion of a silicon-containing chip 168 where a second set of spacers 150 are etched through it with silicon bridges 166 holding the spacers 150 in place within silicon-containing chip 168.

FIG. 4A shows top view of a silicon chip 410 which was etched out of a wafer of the kind described in FIG. 3A with the chip 410 having silicon posts 401–408 which are held in place by silicon frame 400.

FIG. 4B shows top view of a silicon chip 430 which was etched out of a wafer of the kind described in FIG. 3A with the chip 430 having silicon posts 421–428 and a component 438, which are held in place by silicon frame 420.

FIG. 4C shows top view of a silicon chip 450 which was etched out of a wafer of the kind described in FIG. 3A with the chip 450 having silicon posts 442–445 which are held in place by silicon frame 440.

FIG. 4D shows top view of a silicon chip 470 which was etched out of a wafer of the kind described in FIG. 3A with the chip 470 having silicon posts 462–465 and a component 478, which are held in place by silicon frame 460.

FIG. 5A shows a schematic of part of an alignment jig 500; the part of the alignment jig shown includes a base plate 502 with two fixed posts 508 and 509 with silicon-containing components 506 placed on the base plate and part of a cantilever arm 510 which is in contact with the base plate 502.

FIG. 5B shows a schematic of the cantilever arm 510 in detail. FIG. 5B includes a stand 520, leaf spring 524, with the end of cantilever arm 510 attached to a turning head 528, a tilting frame 530, and a rotating pushing pin 514.

FIG. 5C shows a close up view of base plate 502 having the two fixed posts 508 and 509 with the pushing pin 514 of the cantilever arm (not shown) such that the V-grooves 503 of a component 506 placed on the base plate partially align with the two poles 508 and 509 and also with a pushing pin 514.

FIG. 6C shows top view of the two components 644 and 646 placed randomly on the base plate 642 prior to being aligned.

FIG. 6D shows the alignment process where pushing pin 654 pushes on walls of V-groove 653 of the two components 644 and 646 and generates a rotation in the direction shown by the arrow 659.

FIG. 6E shows the top view of components 644 and 646 after they are aligned and stacked on the base plate 642 using the alignment jig FIGS. 7A–7F illustrate an embodiment where different types of components are aligned using the alignment jig of the kind described in FIGS. 5A–5C. The components illustrated in the FIGS. 7A–7F include a silicon structure mounted over an insulating glass structure.

FIG. 7A shows an extractor 720 for an electron detecting device having a silicon structure 772 mounted on a glass structure 773 with V-grooves 784 etched through the four corners of the extractor 720.

FIG. 7B shows a spacer 730 having a silicon structure 774 mounted on a glass structure 775 with V-grooves 785 etched through at the four corners of the spacer 730.

FIG. 7C shows a condenser 740 having a silicon structure 776 mounted on a glass structure 777 with V-grooves 786 etched through at the four corners of the condenser 740.

FIG. 7D shows an anode 750 having a silicon structure 778 mounted on a glass structure 779 with V-grooves 787 etched through at the four corners of the anode 750.

FIG. 7E shows a blanker 760 having a silicon structure 780 mounted on a glass structure 781 with V-grooves 788 etched through at the four corners of the blanker 760.

FIG. 7F shows an aperture 770 having a silicon structure 782 mounted on a glass structure 783 with V-grooves 789 etched through at the four corners of the aperture 770.

DETAILED DESCRIPTION OF PREFERRED EMBODIMENTS

As a preface to the detailed description, it should be noted that, as used in this specification and the appended claims, the singular form of "a", "an" and the "the" include plural referents, unless the context clearly dictates otherwise. Thus, for example, the term "a semiconductor" includes a variety of different materials which are known to have the behavioral characteristics of a semiconductor, reference to "an electrical insulator" includes, for example, dielectric materials known in the art, both organic and inorganic and physical constructs which operate as an electrical insulator, such as vacuum and various gases present in spaces between conductive surfaces.

Silicon has frequently been mentioned as a material in the fabrication of MEMS. Such silicon may have sufficient impurities or doping to permit adequate charge transfer in particular applications which are electrical or optical-electrical. Other conductive materials, including but not limited to other semiconductor materials or metals may be used in place of silicon. Clearly, the number of structures used to make the MEMS may vary as desired.

MEMS structures may be fabricated using a plurality of layers which include conductive material and electrically insulating materials. In one well known embodiment, glass was used as the electrically insulating material and stacks of anodically bonded glass and silicon layers were used to form a device. However, the use of glass has been found to create problems during the fabrication process. For example, design limitations may occur due to the lower machine tolerances of glass compared to silicon; stress may be created during anodic bonding of silicon with glass, due to the differences thermal expansion coefficient; in addition, sodium compounds may be formed at the interfaces between silicon layers and the interfacing glass layers which reduce bond strength, or prevent bonding altogether.

Figure 1A:
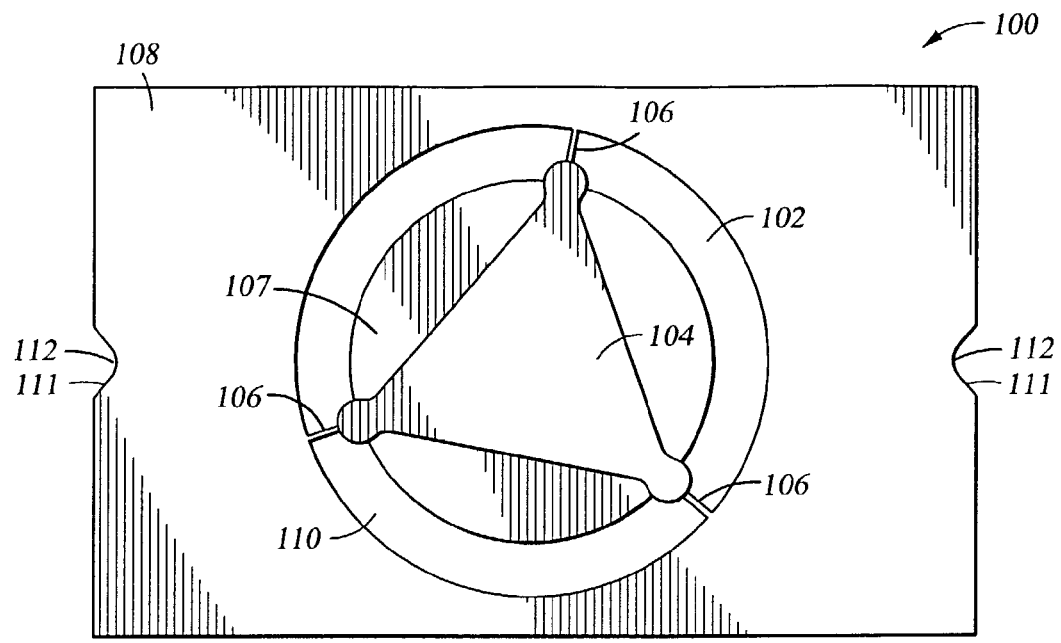
FIGS. 1A–1D illustrate one embodiment of fabrication of a three dimensional MEMS structure, using spacers made of silicon to separate silicon components from one another. Vacuum or a gaseous composition or an electrically insulating component is present in the space between the silicon components.

We have developed methods of fabricating MEMS structures which avoid the kinds of problems described above. FIGS. 1A-1D illustrate how to build a three dimensional MEMS structure using silicon components, separated by spacers made of silicon, where electrical isolation is obtained using a gas or vacuum or other insulating material between the stacked silicon layers. FIGS. 1A–1D are top views of a silicon chips produced by dry anisotropic etching of a wafer (not shown) containing the chip. The wafer was subsequently diced to provide chips of the kind shown in FIGS. 1A–1D. Instead of dicing, chips may also be etched out of a wafer at the same time as the wafer is etched, provided, the wafer that is being etched is a carrier wafer. FIG. 1A shows a chip 100 including a gap 102 etched through the chip 100 leaving behind an outer chip frame 108, a center portion 107, which contains a first triangular chip component 104, which is connected by silicon bridges 106 to the outer frame 108. An aluminum layer (not shown) on the backside (not shown) of the chip 100 may be used as an etch stop. Indentations 111, containing alignment portions 112 are etched at the periphery of the chip 100. After etching, only aluminum holds silicon pieces 110, 107 and 112 in place. By stripping of the aluminum etch stop film, regions 110, 107, and 112 drop out of the chip 100, leaving behind the triangular component 104 connected to the outer frame 108, by silicon bridges 106. To minimize "loading effects" and "RIE-lag" the silicon pieces 110, 107 and 112 were "cut out" of the wafer rather than etched out of the wafer.

Figure 1B:
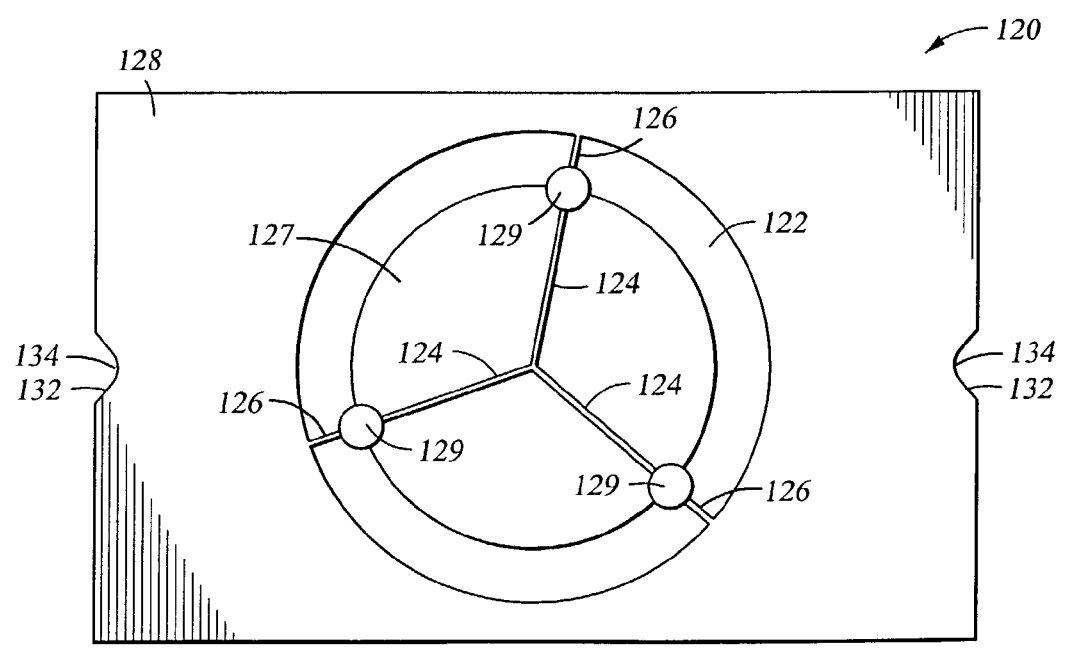

FIG. 1B shows a first set of silicon spacers 129 etched within a silicon chip 120. A piece 122 is cut out of silicon chip 120 utilizing an underlying aluminum etch stop layer (not shown), creating an outer frame 128. Center portions 127 are also cut away, in addition to the piece 122, to create spacers 129. Indentations 132, containing alignment portions 134 are also etched into the silicon chip 120 to subsequently assist in aligning the silicon triangular components 104 shown in FIG. 1a. Once again, by stripping of the aluminum etch stop regions, piece 122, center portions 127, and the alignment portions 134 are removed, leaving behind spacers 129, connected to the outer frame 128 by silicon bridges 126, and to one another by silicon bridges 124 to provide stability.

Figure 1C:
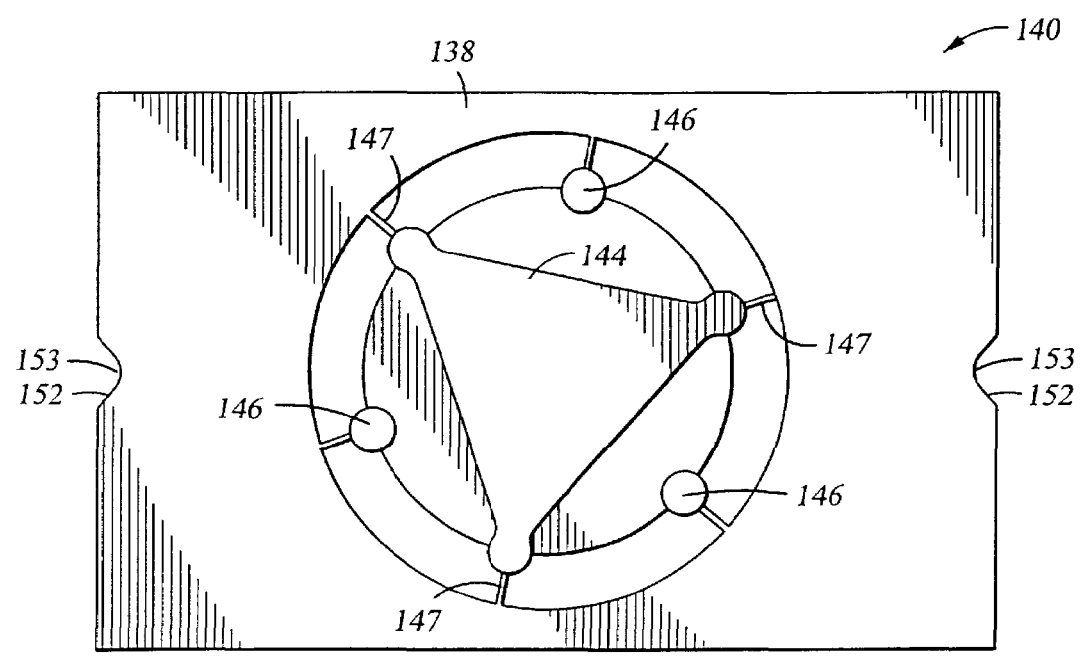

FIG. 1C is a schematic of the top view of a silicon chip 140 similar to the one shown in FIG. 1A except that the figure shows additional spacers 146. The triangular component, 144 is rotated at an angle with respect to the frame 138. Indentations 152, containing alignment portions 153 are etched at the periphery of the chip 140. After etching of the silicon overlying an aluminum etch stop, as described with respect to FIG. 1A, the triangular component 144, and spacers 146 remain, all attached to the outer frame, 138 by silicon bridges 147.

Figure 1D:
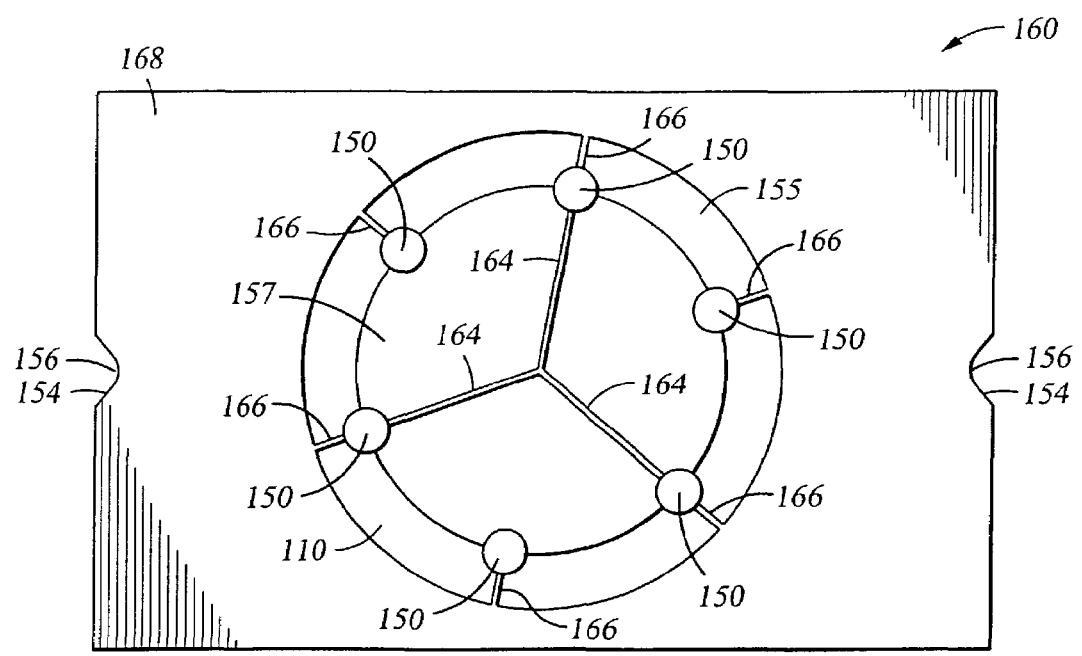

FIG. 1D similarly shows how a second set of spacers are etched from a silicon chip 160. The method of fabricating the second set of spacers is exactly the same as the method described in FIG. 1B. A piece 155, and center portions 157 are cut out of silicon chip 160 utilizing an underlying aluminum etch stop layer (not shown) to create spacers 150. Indentations 154, containing alignment portions 156 are also etched into the silicon chip 160 to subsequently assist in aligning the silicon triangular components 144 shown in FIG. 1B. Once again, after stripping of the aluminum etch stop regions, the only part remaining are the spacers 150 connected to the outer frame 168, by silicon bridges 166, and a plurality of spacers 150 are connected to one another by silicon bridges 164.

Once the chips with the triangular components and the spacers are generated using the method described above, components are carefully cleaned to remove masking materials on the silicon surfaces in order to prepare the components for the following process steps. Cleaning may be performed by an RCA cleaning, in a manner known in the art.

The chips are then stacked one on top of the other. For example, the chip 140 (containing second triangular component 144) is stacked on top of the chip 160 (containing second spacers 150). Next, the chip 120 (containing first spacers 129) is stacked on the chip 140, and then the chip 100 (containing the first triangular component 104), is stacked on the chip 120. It is understood that even though only two triangular components are shown in this illustration, more than two components and more than two sets of spacers of different shapes can be stacked on top of each other to create a particular MEMS structure. The chips in the stack of chips may then be aligned relative to each other using the indentations located on each chip frame. Alignment of the chips using a special alignment jig will be described subsequently herein. The alignment jig including the stack of chips may then be heated to a temperature adequate to activate fusion bonding of the contacting portions within the silicon chips. Standard procedures for fusion bonding are known in the art, and may be applied as appropriate, depending on the device being fabricated.

The temperatures necessary to achieve a sufficient bonding strength during fusion bonding depend on the surface conditions of the chips, such as roughness and cleanliness. To be in condition for fusion bonding, the surface condition of the chip should be such that surface roughness is no more than a few tenths of a nanometer, and the surface has been cleaned by RCA cleaning. The bonding temperature may be limited by the temperature capability of the jig in which the chips are retained. An initial pre-bonding may need to be carried out at a lower temperature, in the range of about 300° C. in vacuum. To improve the bonding strength, the stack may then be removed from the jig and heated to 1000° C. in a furnace in an inert gas at atmospheric pressure. To achieve a high bonding strength, the bonding surfaces need to be in good contact during the bonding process. The presence of hydroxyl groups on silicon surfaces helps the fusion bonding process. Hydroxyl groups may be produced on the silicon surface by using the RCA1 cleaning process as the last step of the complete RCA cleaning. At temperatures between about 200° C.–400° C., a chemical reaction of the hydroxyl groups allows a pre-bonding of the interfaces. At temperatures above about 700° C., a covalent bond of Si—O—Si is formed at the interface between contacting silicon surfaces; and at temperatures above 900° C. the oxygen on the interface diffuses into the silicon lattice and provides a Si—Si bond.

In addition to fusion bonding, other standard bonding procedures can be used, depending on the application. When the device structure requires lower temperatures, application of a sputtered thin layer of thin gold on one side of each chip, enables eutectic bonding at a temperature of about 370° C. Adhesive bonding or soldering may be used, depending on the end use application.

Subsequent to bonding of the stack of chips, the pads of the second spacers located at the bottom of the stack may then be connected to a base plate by solder bonding to a ceramic piece with metal traces, for example and not by way of limitation. Finally, the silicon bridges between components and spacers and the outer frame in which they reside are removed, to release the outer frame. In order to minimize the mechanical stress caused by the removal of the frame, the bridges are stacked over each other at the periphery of the inner components. A saw may then be used to remove the silicon bridges. In an alternative design, the indentations may be part of a component rather than located on the chip frame. In this instance, the chip frame is removed prior to assembly of components.

The space between stacked components is determined by the height of the spacers separating the components. The spacer height can be increased if a greater separation between the components is required. The space between components can be filled with an electrically insulating material if desired. Also, a vacuum may be maintained in the space between components, since vacuum is an excellent insulator. By employing a vacuum between components, contamination of the component surfaces doesn't affect the breakdown voltage between them. Other conductive materials may be used for micromachining, such as nickel, or gold. The spacers may be electrically connected by metal traces patterned on the surface of the base plate to enable application of voltage on the components. Microcolumns of various sizes and shapes may be formed using this method.

Figure 2A:
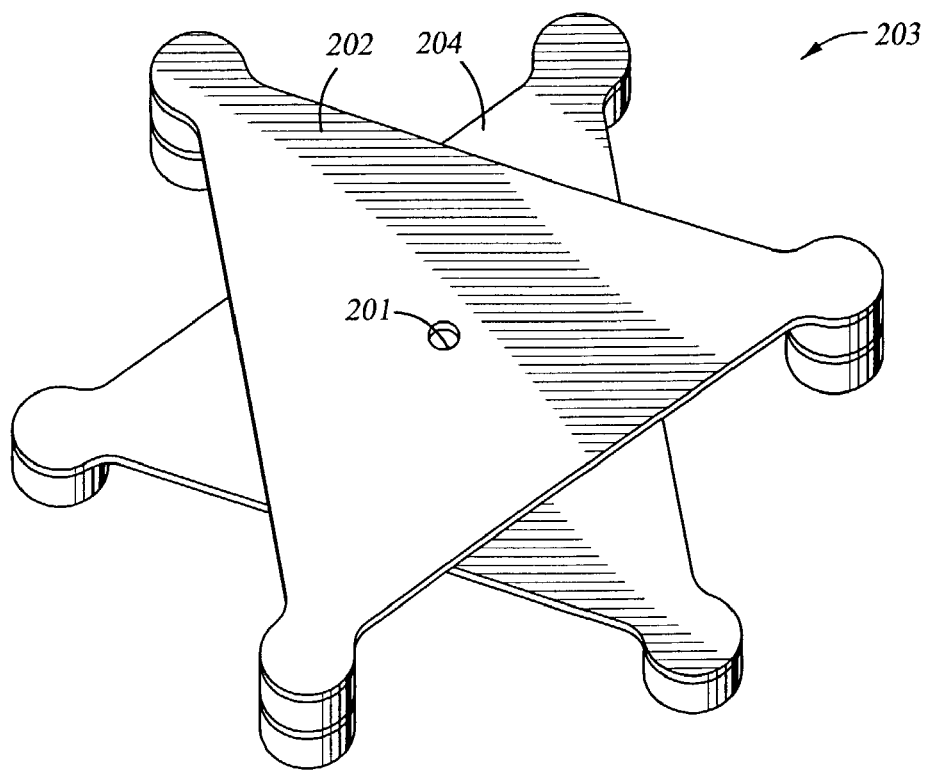
FIG. 2A shows the top view of a stack 203 which includes a silicon component 202 stacked over a second silicon component 204. Stack 203 is formed by stacking, bonding and removing the frame of components and spacers shown in FIGS. 1a–1d.
Figure 2B:
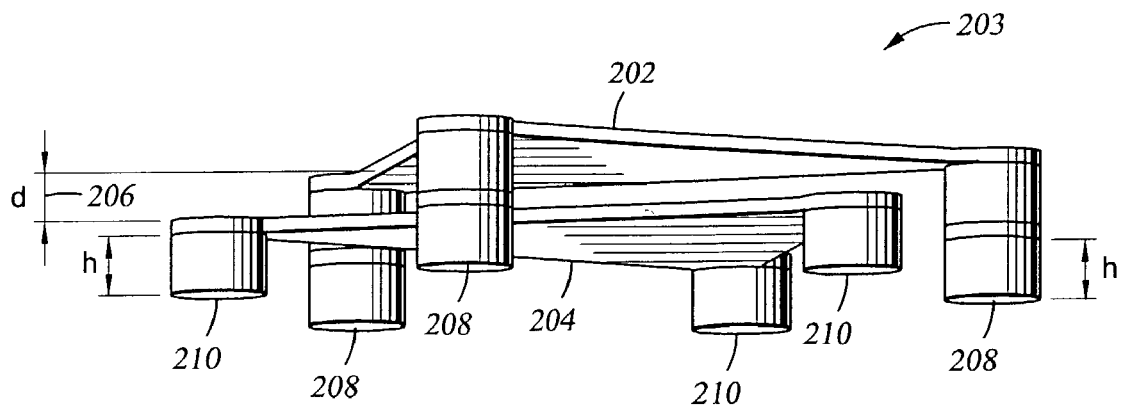
FIG. 2B shows the side view of the stack 203 shown in FIG. 2A. This side view shows the spacial relationship between silicon first component 202 and second component 204. A first set of spacers 208 attached to first silicon component 202 maintains a separation 206 from second silicon component 204, which has shorter spacers 210.

FIG. 2A shows the top view of a stack 203 which includes two triangular components 202 and 204, of the kind described above, stacked one on top of the other. FIG. 2B shows the side view of the two component stack 203. The triangular components 202 and 204 are separated by a distance 206. Triangular component 204 is standing on single spacer 210, with one spacer at each of the three points of the triangle. Triangular component 202 is standing on double spacers 208, with one spacer at each of the three points of the triangle. Height "h" of each spacer, and the number of spacers used, determines the distance "d" 206. The spacers themselves can also act as electrical feedthroughs to connect the components with other elements in a device circuit. In the case of microcolumns, the components may also be equipped with a hole 201 (shown in FIG. 2A) in the center so that an electron beam can pass through hole 201.

Figure 3A:
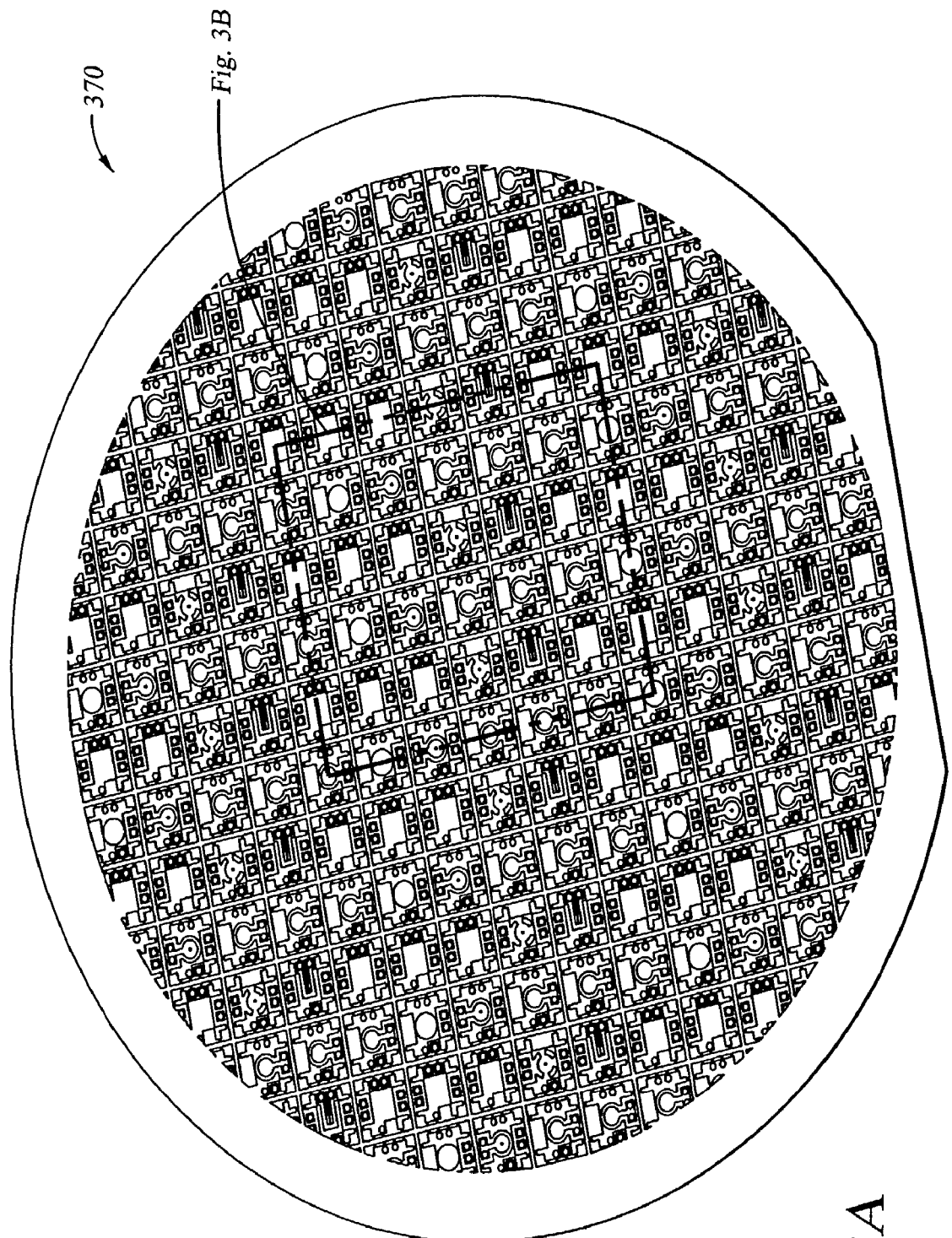
FIG. 3A shows a top view of a silicon wafer 370, which has been etched to form a variety of microcolumn components and spacers. The etched silicon wafer components are for use in the manufacture of a MEMS structure.
Figure 3B:
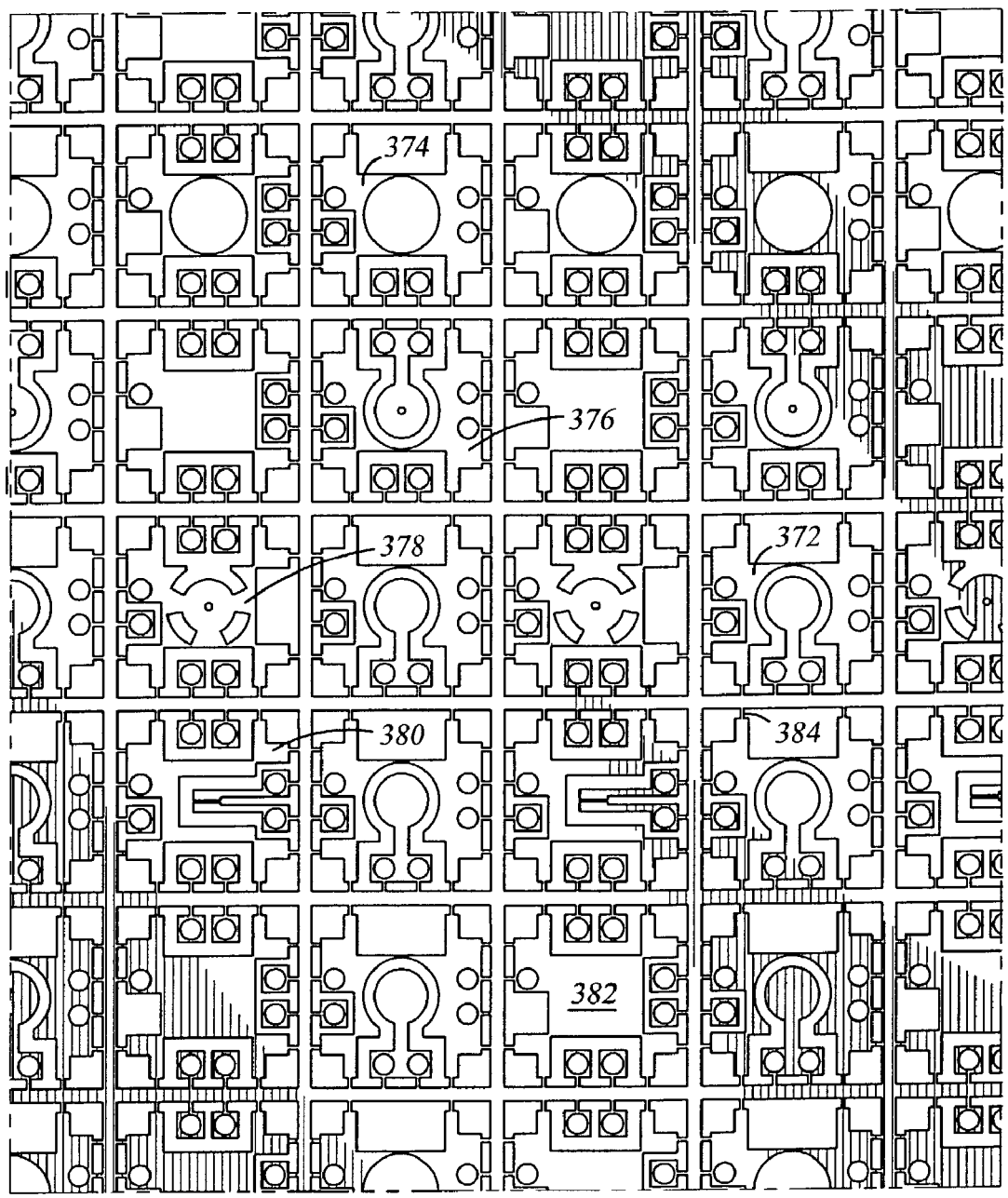
FIG. 3B shows an enlargement of a portion of the etched silicon wafer of FIG. 3A.

In another embodiment, silicon components to be used to form a device are dry etched directly from a silicon wafer. FIG. 3A shows a top view of a silicon wafer 370, after the wafer was dry etched to produce a number of electrical device components. The component etching may be carried out using a process known in the art for etching silicon, preferably, by anisotropic dry etching. FIG. 3B illustrates an enlargement of a portions of silicon wafer 370 (shown in FIG. 3A) which includes various components, such as an extractor 372, a spacer 374, a condenser 376, an anode 378, a blanker 380 and an aperture 382. The components were designed for use in fabrication of a microcolumn which is employed for secondary electron detection. Etching of a variety of components in a single wafer can be particularly advantageous when the various components can be diced out for use in device fabrication.

Components are diced out with high precision dicing. The resist mask for the silicon wafer is designed so that silicon bridges 384 are formed during etching. The bridges 384 serve two purposes: To provide structural support within the silicon wafer and to provide a dicing lane. The bridges 384 are generally not part of the working component so that during dicing, a blade will be directed to the bridges, thus protecting the working component from damage during the dicing operation. In cases where the components are bonded to a borosilicate wafer, dicing of the glass and silicon typically causes chipping. By use of bridges 384, the chipping effect is limited to the bridge areas and does not affect the functional component.

Figure 4A:
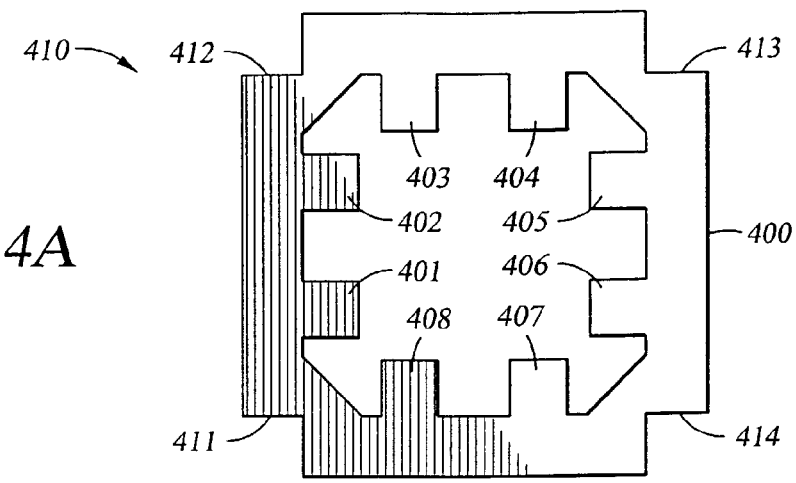
FIGS. 4A–4D show chips 410, 430, 450 and 470, which were etched out of a wafer.
Figure 4B:
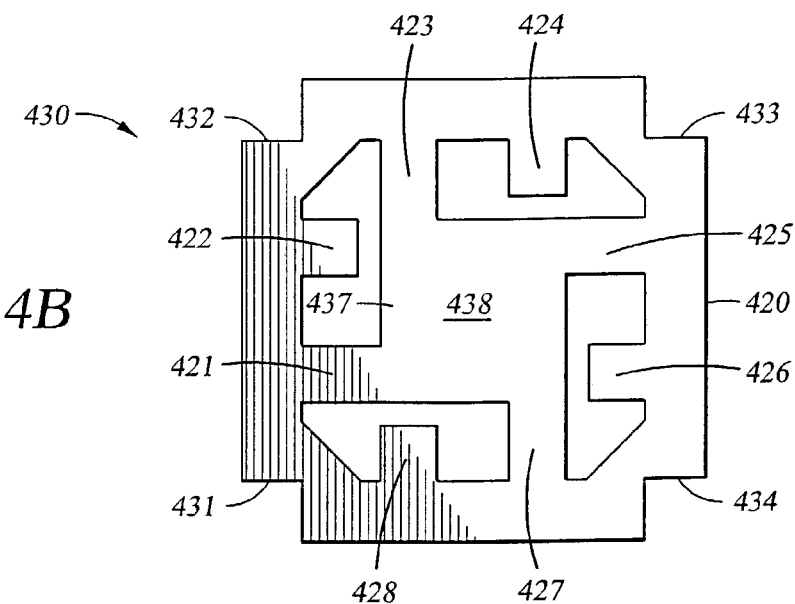
Figure 4C:
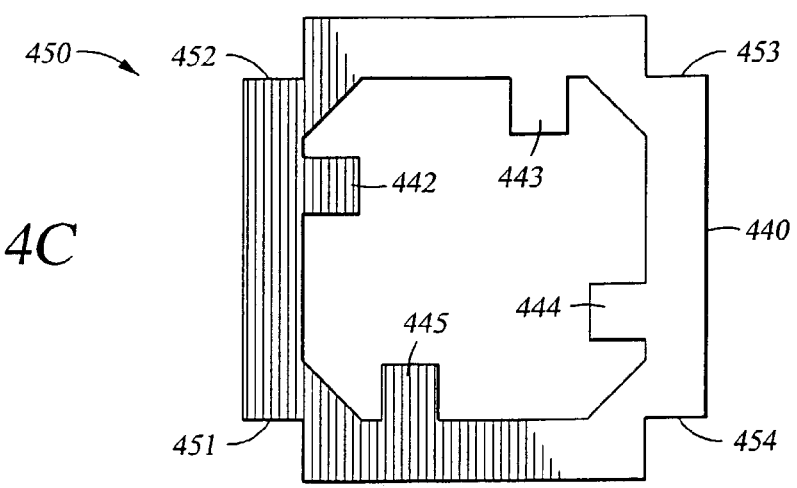
Figure 4D:
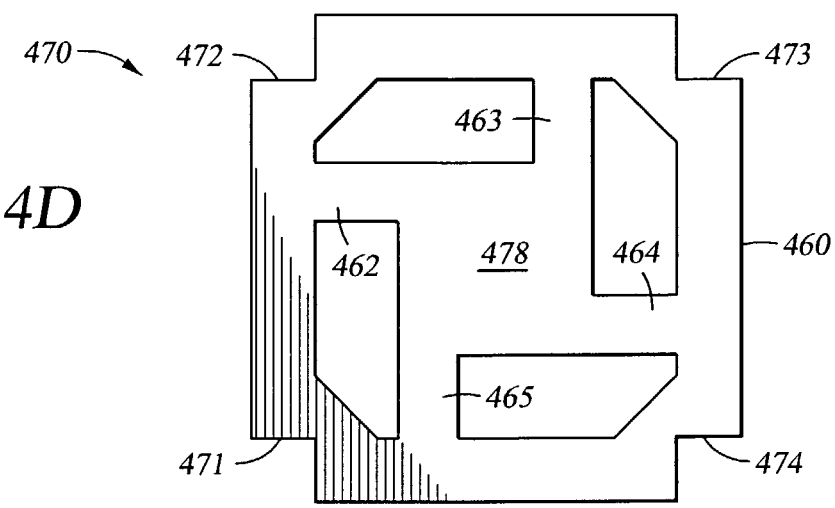

FIGS. 4A–4D show top views of chips 410, 430, 450 and 470, which were etched out of a wafer. The chips 410, 430, 450 and 470 illustrated in FIGS. 4A–4D are similar to the chips illustrated in FIGS. 1A–1D except for the geometry, and the location of the grooves. Also, the chips in FIGS. 4A–4D maintain their respective outer frames during fabrication of the MEMS structure and are removed only after the MEMS structure fabrication is completed. With respect to FIG. 4A, chip 410 includes silicon posts 401–408 which are held in place by a frame 400. Chip 410 further includes V-grooves 411–414 used for alignment of chip 410. FIG. 4B illustrates another chip 430. Chip 430 includes individual silicon posts 422, 424, 426, and 428. Chip 430 also contains a center structure 437 which includes silicon posts 421, 423, 425 and 427 as well as a MEMS component 438. Depending on the device, the MEMS component 438 may be many times larger than the silicon posts 421–428. FIG. 4B also includes V-grooves 431–434 which may be used for alignment of chip 430. FIG. 4C illustrates another chip, 450, similar to chip 410 shown in FIG. 4A. The chip 450 includes silicon posts 442–445 which are held in place by silicon frame 440. V-grooves 451–454 are machined into the frame 440 to be used for alignment. FIG. 4D illustrates another chip, 470, which includes a MEMS component 478 and silicon posts 462–465 which are held in place by silicon frame 460. V-grooves 471–474 are machined into the frame 460 to be used for alignment of chip 470.

In order to fabricate a MEMS structure, chip 430 is placed on top of chip 410, chip 450 is placed on top of chip 430, and chip 470 is placed on top of chip 450 creating a stack of the chips. The stack may then be aligned and bonded together. Alignment and bonding can be performed by any of the methods known in the art. If the bonding method used is silicon fusion bonding, then the chips may be aligned and pre-bonded at 300° C. on an alignment jig which is described in detail in a later section. After pre-bonding, the stack alone, without the alignment jig, may be fusion bonded in a furnace at a temperature above 900° C. If low temperature is required, then eutectic bonding would be ideal. For eutectic bonding, each chip may be coated on one side with a gold layer prior to bonding. The gold forms an alloy with silicon at a temperature higher than 363° C. Eutectic bonding of silicon with gold or aluminum can be completed on the alignment jig, because the temperature required for eutectic bonding is below the maximum operating temperature of the alignment jig which may be made of materials such as stainless steel.

Figure 4E:
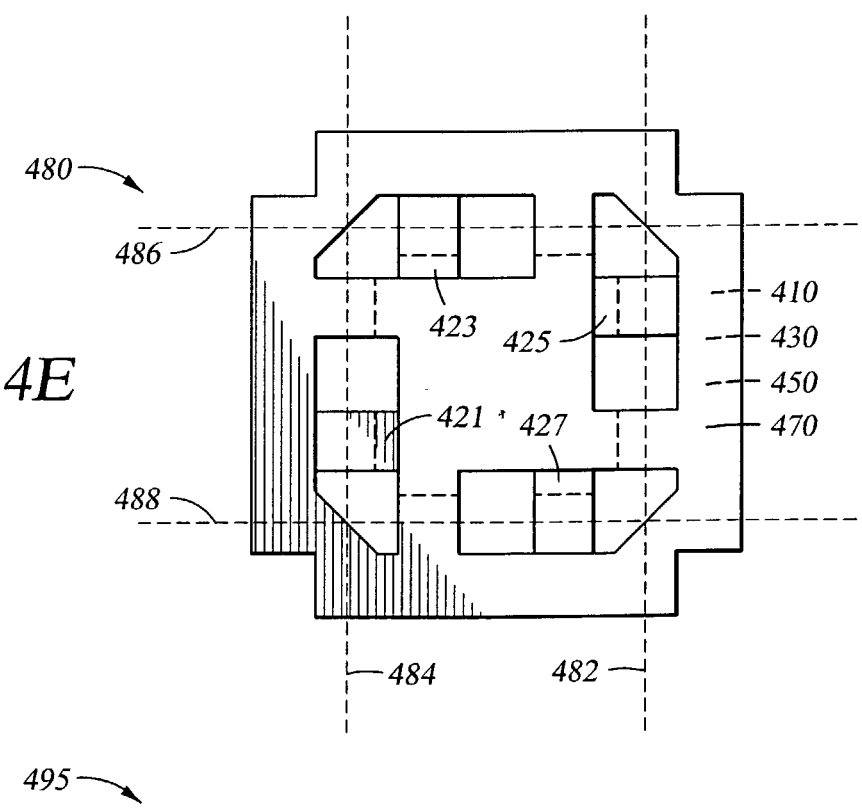
FIG. 4E shows a top view of MEMS structure 480. The MEMS structure 480 is fabricated by stacking chips, shown in FIGS. 4A–4D.

FIG. 4E illustrates a top view of a stack 480 of chips used to form MEMS structure. The stack 480 is prepared by placing chip 430 on top of 410, then placing chip 450 on top of chip 430, and then placing chip 470 on top of chip 450, the stack 480 of chips is then bonded together to form a MEMS structure. The chip 410 is soldered onto a conductive base plate 490 (not shown) with a solder such as an indium-tin solder. Frames 400, 420, 440 and 460 of chips 410, 430, 450 and 470 respectively are then removed from the stack by cutting through the stack along lines 482, 484, 486 and 488, up to the base plate 490 (not shown) and not through the base plate 490.

Figure 4F:
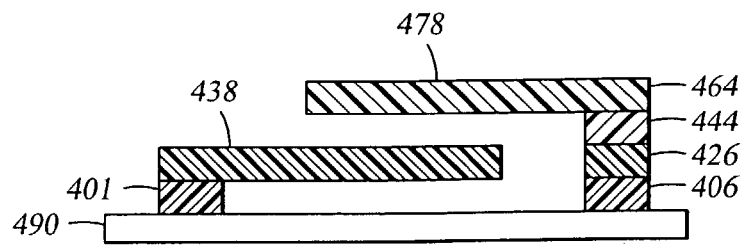
FIG. 4F shows a schematic of a cross section of the MEMS structure 480 shown in FIG. 4E.

FIG. 4F shows a cross section of a MEMS structure 495. The cross section of MEMS structure 495 includes a base plate 490 which underlies silicon posts 401 and 406 from chip 410 (shown in FIG. 4A). Overlying silicon posts 401 and 406 are MEMS component 438 and silicon post 426 respectively from chip 430. Overlying post 426 of chip 430 is post 444 from chip 450. Overlying post 444 of chip 450 are MEMS component 478 and silicon post 464 from chip 470. Metal traces can be implemented into the base plate 490 if electrical connections need to be established between the silicon post 401 and the base plate 490. As can be seen from FIG. 4F, the MEMS components 438 and 478 are separated by the silicon post 444 of chip 450. The silicon post 444 from chip 450 essentially acts as a spacer separating MEMS components 438 and 478. Depending on the size of the MEMS structure desired, the number of components and the number of posts separating the components, may vary. MEMS structures of different sizes and shapes may be fabricated using the above method.

Figure 5A:
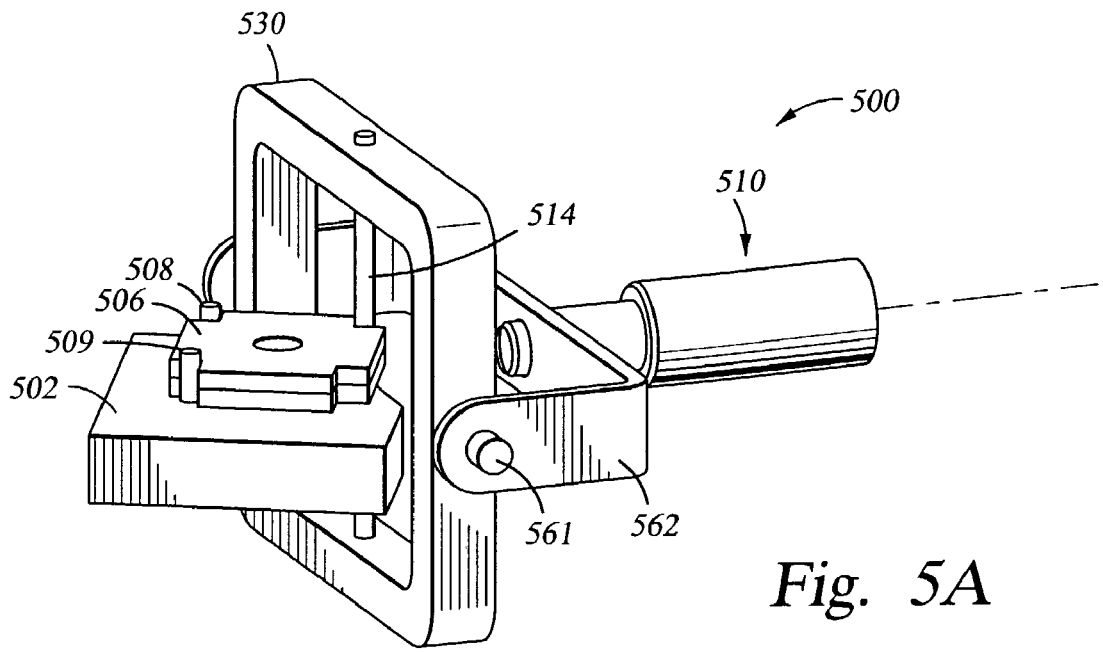
FIGS. 5A–5C show various elements of an alignment jig 500.
Figure 5C:
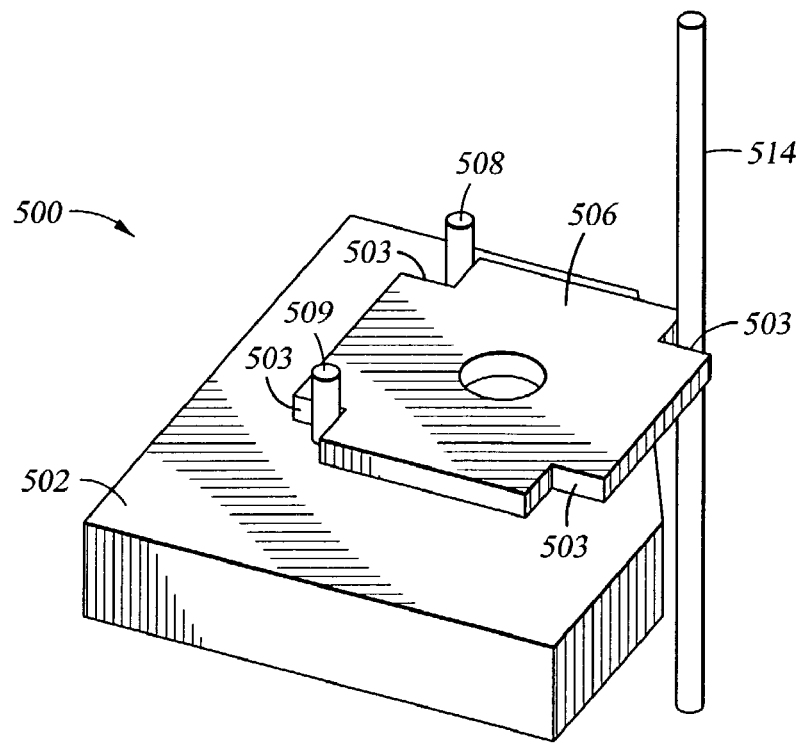
Figure 5B:
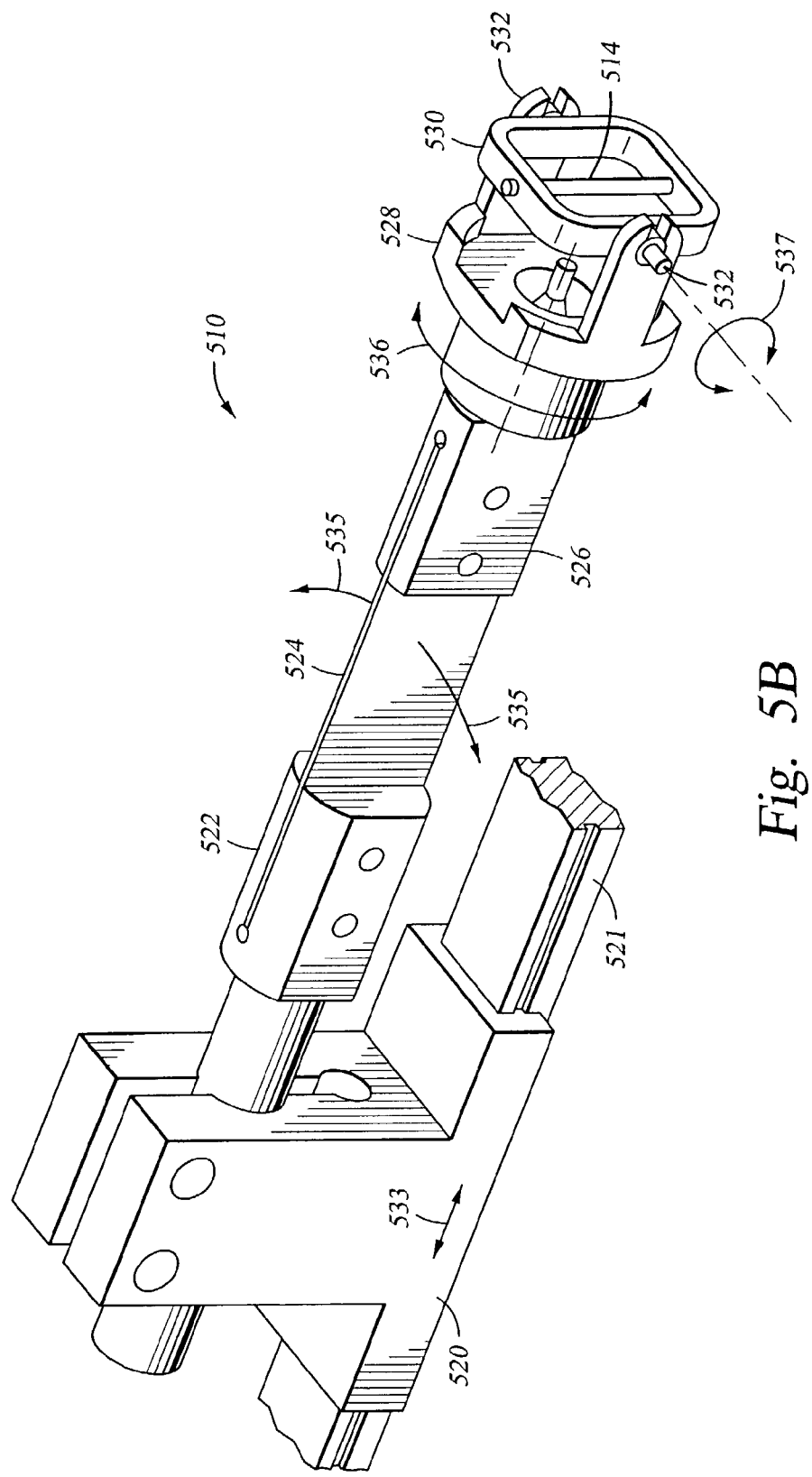

FIGS. 5A–5C illustrate an alignment jig which is useful for positioning and aligning MEMS components of the kind described herein into assemblies. Further illustrated is the manner in which positioning and aligning of the components is achieved. The alignment jig was used to align a stack of ten chips to a precision of better than 2 μm with high repeatability. Further modifications and improvements to the jig might provide even better precision if needed.

FIG. 5A shows a schematic of part of an alignment jig 500. The jig is a mechanical assembly which is precise and cost effective. With reference to FIG. 5A, the alignment jig 500 has a base plate 502 upon which a plurality of substrates such as a wafers, chips, or components 506 are placed for alignment. The base plate 502 has two fixed posts 508 and 509 mounted perpendicular to the base plate 502. Also shown is part of a cantilever arm 510 which is used in combination with the base plate 502. A part of the cantilever arm 510, as shown in FIG. 5A, includes a turning head 562, tilting frame 530, and a pushing pin 514. The pushing pin 514 is pressed into or supported by the tilting frame 530 so it becomes part of the tilting frame. The tilting frame 530 can rotate within bearings 561 located on each side of the turning head 562. The rotation permits the tilting frame 530 to tilt, providing another degree of freedom, apart from those which will be described in detail below. The tilting frame 530 is attached to the turning head 562 through the ball bearings 561 described above.

FIG. 5B is a schematic of a cantilever arm 510 including the portion described above. The cantilever arm has a stand 520 which holds it in place. The stand 520 is connected to a slider 521, which enables the stand to move in the directions indicated by an arrow 533. Cantilever arm 510 further includes a first holder 522 which holds a leaf spring 524. The holder 522 is in direct communication with the stand 520. The leaf spring 524 is connected to the first holder 522 at one end and to a second holder 526 at the other end. The second holder 526 is further attached to a turning head 528 (a different model turning head from what is shown in FIG. 5A). The turning head 528 can rotate in the direction shown by the arrow 536. The turning head 528 is connected to a tilting frame 530 through bearings 532 located on each side of the tilting frame 530. The tilting frame 530 can rotate within bearings which surround a shaft 532, as indicated by the arrow 537. The pushing pin 514 which is used to push against a component structure may be pressed into the tilting frame 530, as previously described. Further, the turning head 528 can rotate in a circular direction in a plane which is perpendicular to the longitudinal direction of cantilever arm 510. Hence, the flexible design of the jig provides 4 degrees of freedom which include moving along the line of pushing, moving perpendicular to the line of pushing and parallel to the base plate, rotation of the turning head and tilting with respect to the turning head. The design may include spring-loaded set screws (not shown) to regulate the pressure of the post against the components.

FIG. 5C shows a close up view of an alignment procedure, where a component 506 is placed on the base plate 502 and the two fixed alignment pins (posts) 508 and 509, mounted on the base plate 502, are partially aligned with V-grooves 503 at the corners of component 506. Pushing pin 514 attached to cantilever arm 510 (not shown) as previously described, facilitates the rotation of the component 506 within a component stack (not shown) as well as rotation of the stack itself. The alignment process essentially involves pushing the wafers or components with etched V-grooves 503, indentations, or other alignment shapes (not shown) to align with fixed posts 508 and 509 on the base plate 502. A heating element (not shown) and thermocouples (not shown), may be integrated into the base plate in order to facilitate bonding of a stack of components in place on the base plate. Depending on the preferred bonding method or selected materials, the base plate can be heated to the required temperature. For example, a temperature of around 300° C. is required for fusion pre-bonding of silicon stacks. If the silicon layers are coated, for example, with gold on one side eutectic bonding can be achieved at a temperature above 363° C. In cases where the stack consists of silicon layers with alternating borosilicate glass layers, the base plate has to be heated to a temperature between 300° C. and 500° C. for anodic bonding. Other bonding methods like curing of spin coated resin may be used as well.

Figure 6A:
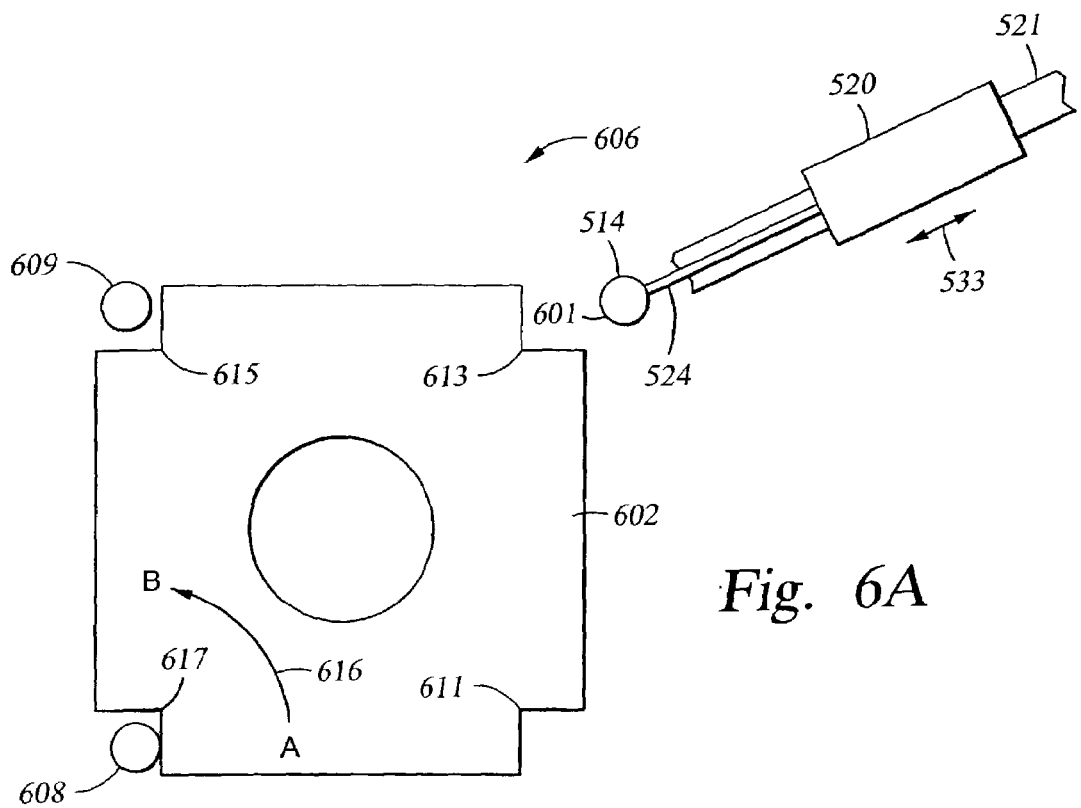
FIG. 6A is a schematic of the top view of a component when placed on a base plate (not shown) prior to being aligned. This figure shows the pushing pin 514 in its initial position 601.
Figure 6B:
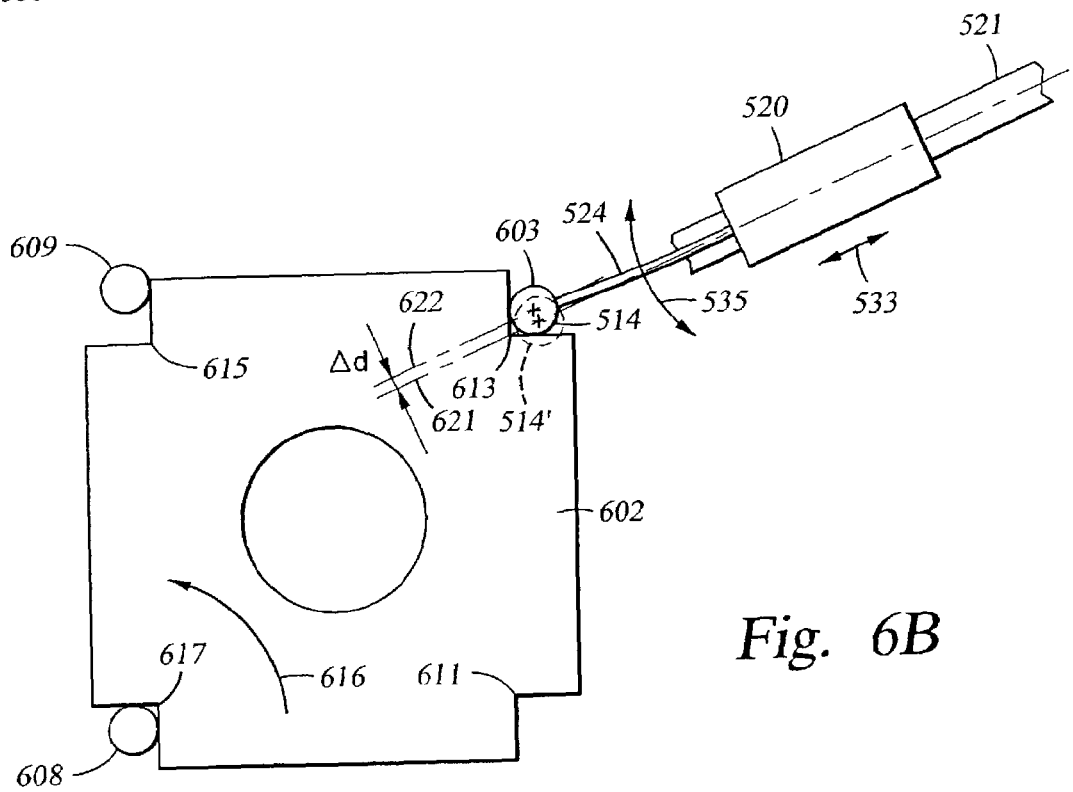
FIG. 6B illustrates the alignment process as the pushing pin moves from its initial position 601 (as shown in FIG. 6A) to its final position 603 by sliding of stand 520, on rails 521.

FIGS. 6A and 6B illustrate the process of aligning a component 602 using an alignment jig of the kind described above. The component 602 includes 4 V-grooves 611, 613, 615 and 617. In FIG. 6A, the component 602 is randomly placed on a base plate (not shown). The posts 608, and 609 are fitted into the V-grooves 617, and 615 respectively, prior to aligning. The pushing pin 514 is held in its initial position 601. Also included in FIG. 6A are parts of the jig which facilitate the movement of the pushing pin 514. For example, the stand 520 on the slider 521 (shown in detail in FIG. 5B), which is indirectly connected to the pushing pin 514. With respect to FIG. 6B, the pushing pin 514 is flexibly 524 connected. First, the pushing pin 514, flexibly attached via leaf spring 524, is released from its initial position 601 (shown in FIG. 6A) and is brought to a second position 603 as the stand 520 slides along the direction shown by the arrow 533. As the pushing pin 514 takes its second position 603, it pushes against at least one wall of V-groove 613 giving the component 602 a rotation and a shift in the direction indicated by the arrow, 616. As a result, the component 606 rotates around a first post 608 in the direction indicated by the arrow 616. The second post 609 acts as a stop for the rotation. In practice, the optimum pushing direction 621 of the pushing pin 514 is different from the moving direction 621 of stand 520. By having a flexible connection such as a leaf spring 524, between the stand 520 and the pushing pin 514, any misalignment of the slider 521 may be corrected. As can be seen in FIG. 6B, by having the flexible leaf spring 524, the pushing pin 514 is deflected from its normal course 621 provided by the movement of the stand 520 to a different course 622 where the two courses are separated by a distance Δd. Also illustrated by dotted lines are the final position 514' of pushing pin 514 if the pushing pin were not deflected. Figure illustrates only two degrees of freedom, shown by arrows 533 and 535, two additional degrees of freedom are achieved by other elements of the apparatus which will be discussed in detail subsequently herein.

The machining tolerances of the V-grooves patterned using optical lithography, for example, and etched by anisotropic dry etching techniques well known in art, are typically one to two orders of magnitude smaller in comparison with alignment jig dimensions and therefore the V-groove tolerances are insignificant in misalignment calculations.

It is particularly important that the fixed posts 608 and 609 be mounted precisely perpendicular to the base plate (not shown). In addition, the diameter of fixed posts 608 and 609 needs to be carefully fabricated with minimal variation as possible. Polished steel or another hard material functions well as a post material. Smooth surfaces on the V-grooves also helps provide better precision alignment.

Figure 6C:
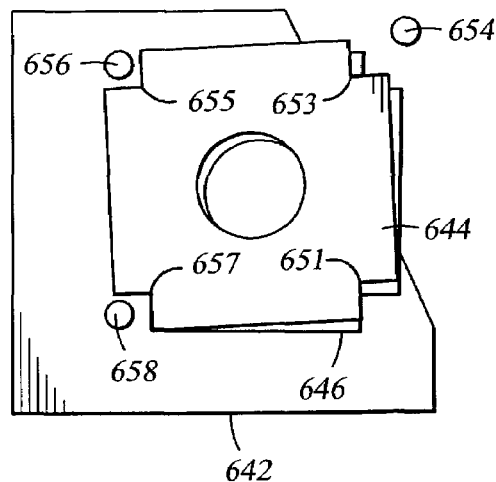
FIGS. 6C–6E illustrate by way of example the steps involved in stacking two components 644 and 646 using an alignment jig of the kind described in FIGS. 5a–5c.
Figure 6D:
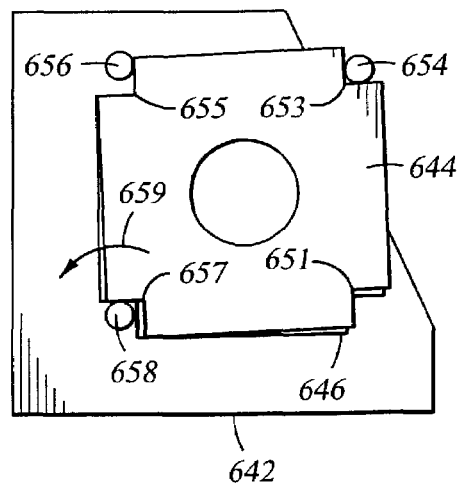
Figure 6E:
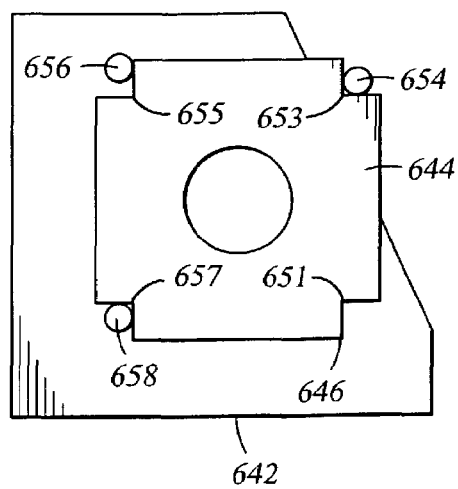

FIGS. 6C–6E further illustrate alignment process of two components using the process described above. FIG. 6C shows a schematic of the top view of two components 644 and 646 placed randomly on a base plate 642. Each of the components 644 and 646 include 4 V-grooves 651, 653, 655 and 657. The fixed posts 656 and 658 and pushing pin 654 are fitted into the V-grooves 655, 657 and 653 respectively. FIG. 6D shows the step where the pushing pin 654 pushes against at least one wall of V-groove 653. The push causes the components 644 and 646 to rotate around the first fixed post 658 in the direction indicated by the arrow 659. The second fixed post 656 acts as a stop for the rotation. The components are aligned by rotating the components around a fixed axis at first fixed post 658 and then jamming them against a second fixed post 656. FIG. 6E shows a top view of components 644 and 646 after the two components are aligned. Ones skilled in art will contemplate that a large number of components or even more than one stack of components may be aligned at the same time using this jig.

Theoretically, any amount of misalignment is constant, and is determined by misalignment of the two fixed poles on the base plate, rather than by the action of the pushing pin. This is because the design of the jig makes the pushing pin extremely flexible and the frictional component is negligible. Experiments with different pusher arm designs revealed that a highly flexible cantilever arm such as that previously described with reference to FIG. 5B resulted in the smallest misalignment. Modification of the design to provide further flexibility to the cantilever arm design is possible.

As described above, the misalignment of the components aligned using the jig is normally caused by the precision in fabrication of the jig itself. For example, the precision of the placement of the posts with respect to the base plate. The precision may depend on the diameter variation of the posts and the pushing pin. Since the same jig is being used over and over, the alignment error caused by the jig becomes a systematic error. This type of systematic error can be compensated through other means. For example, when the misalignment of each component associated with a particular jig is figured out, then that error can be compensated for in the design of the components; for example, the center of the component may be shifted by an amount to correct this error.

The alignment jig of the kind described above can be used to align other types of components than those described above. FIGS. 7A–7F illustrate, as an example, components which are comprised of bonded silicon and glass layers, which components may be aligned using the alignment jig described above. FIG. 7A shows an extractor component 720 which includes a silicon structure 772 mounted on a glass structure 773. V-grooves 784 are etched at the four corners of the extractor component 720, which v-grooves may be used for aligning components using the kind of alignment jig described above. FIG. 7B shows a spacer component 730 which includes a silicon structure 774 mounted on a glass structure 775. The spacer component 730 also includes V-grooves 785 etched at its four corners. FIG. 7C shows a condenser component 740 which includes a silicon structure 776 mounted on a glass structure 777. The condenser component 740 also has V-grooves 786 etched at its four corners. FIG. 7D shows an anode component 750 which includes silicon structure 778 mounted on a glass structure 779. The anode component also has V-grooves 787 etched at its four corners. FIG. 7E shows a blanker component 760 which includes a silicon structure 780 mounted on a glass structure 781. The blanker component 780 also has V-grooves 788 etched at its four corners. FIG. 7F shows an aperture component 770 which includes a silicon structure 782 mounted on a glass structure 783. The aperture component 770 also has V-grooves 789 etched at its four corners.

Figure 7G:
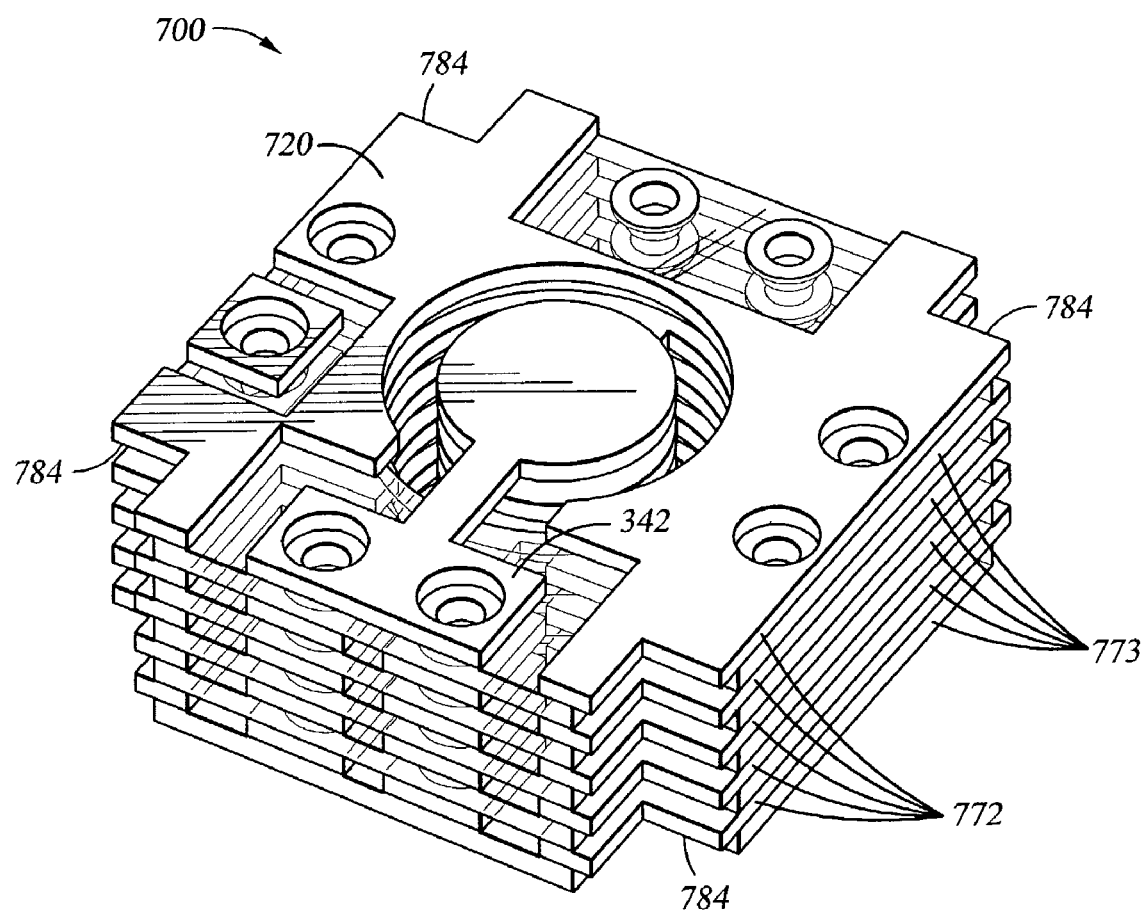
FIG. 7G shows a three-dimensional view of a stack of extractors of the kind shown in FIG. 7A which are aligned and bonded to fabricate a MEMS structure 700.

FIG. 7G shows top view of a stack of extractor components 700 of the kind shown individually in FIG. 7A as component 720. The extractor components in stack 700 may be bonded together to create a MEMS structure. As previously described, the extractors 720, within the component stack 700 include alternating layers of a silicon structure 772 and glass a structure 773. The extractor component 720 further includes V-grooves 784, which may be used for aligning the components using the kind of alignment jig described above.

The glass structures 773 (which could also be fabricated from an electrically insulative material other than glass) may be micromachined using techniques known in the art. However, the drilling of the glass is generally less precise compared to the etching of the silicon. Therefore, the glass may be recessed from the edge of the component so that only the silicon v-grooves contact the alignment posts in the alignment jig. Generally, for most applications, the alignment inaccuracy which might occur due to less precise machining of glass can be avoided. Generally, with respect to aligning a stack of components such as those shown in FIG. 7G, over etching or under etching will not affect the alignment as long as all components of a stack are fabricated on one wafer, so that each component over or under etched to the same degree.

The above described preferred embodiments are not intended to limit the scope of the present invention, as one skilled in the art can, in view of the present disclosure, expand such embodiments to correspond with the subject matter of the invention claimed below.

We claim:

1. A method of fabricating a MEMS structure, wherein the fabrication employs a stacking arrangement of device components, and wherein an electrically isolating fluid material is used between stacked device components of said MEMS structure, comprising:
   a) providing at least two silicon-containing component structures;
   b) providing at least one spacer component structure which is separate from said silicon-containing component structures;
   c) stacking said at least two silicon-containing component structures with said at least one spacer component structure in a manner such that a space which can be filled with an electrically isolating fluid material is formed between at least a portion of said silicon-containing component structures;
   d) filling said space with said electrically isolating fluid material; and
   e) reacting or drying said electrically isolating fluid material to produce a solid.

2. A method in accordance with claim 1, wherein, prior to filling of said electrically isolating space, said silicon-containing component structures and said at least one spacer are precision aligned with respect to one another.

3. A method in accordance with claim 2, wherein said silicon-containing component structures and spacers are bonded in place relative to each other after precision alignment and prior to filling of said electrically isolating space.

4. A method in accordance with claim 3, wherein said bonding is achieved using a bonding technique selected from the group consisting of anodic bonding, fusion bonding, eutectic bonding, soldering or gluing.

5. A method of fabricating a MEMS structure, wherein the fabrication employs a stacking arrangement of device components, and wherein a gas composition, a vacuum, or a fluid dielectric material is used between stacked components as an electrically isolating component of said MEMS structure, comprising:
  a) providing at least two silicon-containing component structures;
  b) providing at least one spacer component structure which is separate from said silicon-containing component structures;
  c) stacking said at least two silicon-containing component structures with said at least one spacer component structures in a manner such that a space which can be filled with an electrically isolating fluid material is formed between at least a portion of said silicon-containing component structures;
  d) precision aligning said silicon-containing component structures and said at least one spacer with respect to one another; and
  e) bonding said spacers in place relative to each other using eutectic bonding.

6. A method of fabricating a MEMS structure, wherein the fabrication employs a stacking arrangement of device components, and wherein a gas composition, a vacuum, or a fluid dielectric material is used between stacked components as an electrically isolating component of said MEMS structure, comprising:
  a) providing at least two silicon-containing component structures;
  b) providing at least one spacer component structure which is separate from said silicon-containing component structures;
  c) stacking said at least two silicon-containing component structures with said at least one spacer component structures in a manner such that a space which can be filled with an electrically isolating fluid material is formed between at least a portion of said silicon-containing component structures; and
  d) precision aligning said silicon-containing component structures and said at least one spacer with respect to one another, wherein said silicon-containing components and said at least one spacer are held in place relative to each other by a retainer.

7. A method in accordance with claim 6, wherein said electrically isolating fluid is a polymeric material which is cured in place to form a rigid MEMS structure.

8. A method of fabricating a MEMS structure, wherein the fabrication employs a stacking arrangement of device components, and wherein a gas composition, a vacuum, or a fluid dielectric material is used between stacked components as an electrically isolating component of said MEMS structure, comprising:
  a) providing at least two silicon-containing component structures;
  b) providing at least one spacer component structure which is separate from said silicon-containing component structures;
  c) stacking said at least two silicon-containing component structures with said at least one spacer component structures in a manner such that a space which can be filled with an electrically isolating fluid material is formed between at least a portion of said silicon-containing component structures; and
  d) precision aligning said silicon-containing component structures and said at least one spacer with respect to one another, wherein said silicon containing components and said at least one spacer are held in place relative to each other using an interlocking mechanism.

9. A method in accordance with claim 6 or claim 8, wherein said silicon-containing components and said at least one spacer are aligned using an alignment jig.

10. A method in accordance with claim 8, wherein said electrically isolating fluid is a polymeric material which is cured in place to form a rigid MEMS structure.

11. A method of fabricating a MEMS structure, wherein the fabrication employs a stacking arrangement of device components, and wherein an electrically isolating fluid material is used between stacked device components of said MEMS structure, comprising:
  a) providing at least two silicon-containing component structures;
  b) providing at least one spacer component structure which is separate from said silicon-containing component structures;
  c) stacking said at least two silicon-containing component structures with said at least one spacer component structure in a manner such that a space which can be filled with an electrically isolating fluid material is formed between at least a portion of said silicon-containing component structures;
  d) precision aligning said silicon-containing component structures and said at least one spacer with respect to one another;
  e) bonding said spacers in place relative to each other;
  f) filling said space with said electrically isolating fluid material, wherein said electrically isolating fluid is a polymeric material; and
  g) curing said electrically isolating fluid in place to form a rigid MEMS structure.

12. A method of fabricating a MEMS structure from silicon-containing chips, said method comprising:
  providing a plurality of silicon-containing chips, wherein at least two of said chips include device elements, and wherein spacing structures are included within a topography of said chips;
  stacking said silicon-containing chips in a manner so that at least two device elements within said chips are separated by the action of said spacing structures;
  filling said separations between said device elements with an electrically isolating fluid; and
  reacting or drying said electrically isolating fluid to form a solid.

13. A method of fabricating a MEMS structure from silicon-containing chips, said method comprising:
  providing a plurality of silicon-containing chips, wherein at least two of said chips include device elements, wherein spacing structures are included within a topography of said chips, and wherein said topography acts as a retainer; and
  stacking said silicon-containing chips in a manner so that device elements within said chips are separated by the action of said spacing structures.

14. A method of fabricating a MEMS structure from silicon-containing chips, said method comprising:
  providing a plurality of silicon-containing chips, wherein at least two of said chips include device elements, wherein spacing structures are included within a topography of said chips, and wherein said topography acts as an interlocking mechanism; and stacking said silicon-containing chips in a manner so that device elements within said chips are separated by the action of said spacing structures.

15. A method in accordance with claim 13 or claim 14, wherein said silicon-containing chips are aligned using an alignment jig.

16. A method of producing a component or a chip for use in the method of claim 13 or claim 14, respectively, wherein said component or chip is fabricated on a wafer surface and is held in place on said wafer surface by at least one bridge which can be removed or severed to free said component or chip.

17. A method of fabrication of a MEMS structure which employs a fluid dielectric material for electrical isolation purposes, said method comprising:

providing at least two silicon-containing wafers including chips which contain etched device component structures;

providing at least one spacer structure which is separate from said at least two silicon-containing wafers which contain device component structures, wherein said spacer structure is a silicon-containing wafer with a topography which acts as a spacer; and stacking said at least two silicon-containing wafers containing said device component structures in combination with said at least one spacer structure in a manner such that an electrically isolating space is formed by the action of said at least one spacer structure.

18. A method in accordance with claim 17, wherein said electrically isolating space is filled with a gas or a vacuum.

19. A method in accordance with claim 17, wherein said silicon-containing wafers are held in place relative to each other by a retainer.

20. A method in accordance with claim 17, wherein at least one silicon-containing wafer is bonded where a spacer structure is in contact with said wafer.

21. A method in accordance with claim 20, wherein said bonding is selected from the group consisting of anodic bonding, fusion bonding, eutectic bonding, soldering or gluing.

22. A method in accordance with claim 21, wherein said bonding is anodic bonding.

23. A method in accordance with claim 20, wherein said stacked wafers are aligned using a mechanical alignment jig prior to bonding.

24. A method of fabrication of a MEMS structure which employs a fluid dielectric material for electrical isolation purposes, said method comprising:

providing at least two silicon-containing wafers including chips which contain etched device component structures;

providing at least one spacer structure which is separate from said at least two silicon-containing wafers which contain device component structures;

stacking said at least two silicon-containing wafers containing said device component structures in combination with said at least one spacer structure in a manner such that an electrically isolating space is formed by the action of said at least one spacer structure;

filling said electrically isolating space with an electrically isolating fluid; and reacting or drying said electrically isolating fluid to produce a solid.

25. A method of fabrication of a MEMS structure which employs a fluid dielectric material for electrical isolation purposes, said method comprising:

providing at least two silicon-containing wafers including chips which contain etched device component structures;

providing at least one spacer structure which is separate from said at least two silicon-containing wafers which contain device component structures; and stacking said at least two silicon-containing wafers containing said device component structures in combination with said at least one spacer structure in a manner such that an electrically isolating space is formed by the action of said at least one spacer structure, wherein said silicon-containing wafers are held in place relative to each other by a retainer.

26. A method of fabrication of a MEMS structure which employs a fluid dielectric material for electrical isolation purposes, said method comprising:

providing at least two silicon-containing wafers including chips which contain etched device component structures;

providing at least one spacer structure which is separate from said at least two silicon-containing wafers which contain device component structures; and stacking said at least two silicon-containing wafers containing said device component structures in combination with said at least one spacer structure in a manner such that an electrically isolating space is formed by the action of said at least one spacer structure, wherein said silicon-containing wafers are held in place relative to each other using an interlocking mechanism.

27. A method in accordance with claim 17, or claim 20, or claim 19, or claim 25, or claim 26, wherein a gas or a combination of gases is disposed within said electrically isolating space.

28. A method of aligning a wafer, chip, or device component during the fabrication of a MEMS structure using an alignment jig, comprising:

a) stacking a plurality of wafers, chips or device components, with at least a portion of said wafers, chips or device components including an alignment shape on at least one surface of said wafer, chip or device component;

b) pushing a first alignment shape with a pusher, generating a rotation of said wafer, chip or device component around a first fixed post located adjacent to a second alignment shape; and c) stopping rotation by pushing said wafer chip or device component so that it aligns with a second fixed post at a third alignment shape, whereby all wafers are aligned with respect to one another.

29. The jig in accordance with claim 28, wherein said pushing pin is rotatable within said tilting frame.

30. An alignment jig for aligning at least two wafers, chips, or device components in a multi-layered, stacked structure, wherein said wafer, chip or device component includes a plurality of alignment shapes located on a surface of said wafer, chip or device component, said alignment jig comprising:

a) a base plate with a plurality of fixed posts against which said wafers, chips, or device components are positioned, and around which said wafers, chips, or device components may be rotated;

b) a cantilever arm which is used in combination with said base plate;

c) a turning head which is in communication with said cantilever arm;
d) a pusher which is connected to said turning head;
c) a tilting frame which is mounted on a shaft which rotates within said pusher; and
d) a pushing pin supported within said tilting frame, wherein said wafers, chips or device components are pushed against said fixed posts on said base plate using a rotation generated by contact of said pushing pin against an alignment shape located on a surface of said wafer, chip or device component.

31. An alignment jig for aligning at least two wafers, chips, or device components in a multi-layered, stacked structure, wherein said wafer, chip or device component includes a plurality of alignment shapes located on a surface of said wafer, chip or device component, said alignment jig comprising:
   a) a base plate with two fixed posts against which said wafers, chips, or device components are positioned;
   b) a cantilever arm which is used in combination with said base plate, said cantilever arm being attached to a stand which is movable along a line of pushing which is to be employed in aligning said wafers, chips or device components;
   c) said cantilever arm including a first holder which is in communication with said stand; a leaf spring extending from said first holder at a first end of said leaf spring; a second holder attached to said leaf spring at a second end of said leaf spring; a turning head in communication with said second holder, which turning head can freely rotate around said line of pushing; a tilting frame rotatably mounted on said turning head, which tilting frame can tilt freely with respect to said turning head; and
   d) a pushing pin supported within said turning head, whereby said alignment jig provides at least four degrees of freedom, including movement of said stand along said line of pushing, movement of said leaf spring at various angles from said line of pushing and parallel to said base plate, rotation of said turning head circumferentially around said line of pushing, and tilting of said tilting frame in a plane which is perpendicular to a plane within which said turning head is rotating.

32. A method of fabricating a MEMS structure, wherein the fabrication employs a stacking arrangement of device components, and wherein an electrically isolating fluid material is used between stacked components of said MEMS structure, comprising:
   a) providing at least two silicon-containing component structures;
   b) providing at least one spacer component structure which is separate from said silicon-containing component structures;
   c) stacking said at least two silicon-containing component structures with said at least one spacer component structure in a manner such that a space which can be filled with an electrically isolating fluid material is formed between at least a portion of said silicon-containing component structures;
   d) precision aligning said silicon-containing component structures and said at least one spacer with respect to one another;
   e) fastening said silicon-containing components with respect to one another;
   f) filling said electrically isolating space with said electrically isolating fluid material, wherein said electrically isolating fluid comprises a polymeric material; and
   g) curing said electrically isolating fluid in place to form a rigid MEMS structure.

* * * * *